United States Patent [19]

Apple, Jr.

[11] 3,882,412

[45] May 6, 1975

[54] DRIFT COMPENSATED PHASE LOCK LOOP

[75] Inventor: Garrett Gordon Apple, Jr., Worthington, Ohio

[73] Assignee: North Electric Company, Galion, Ohio

[22] Filed: Mar. 29, 1974

[21] Appl. No.: 456,213

[52] U.S. Cl. .................... 331/1 A; 331/10; 331/17; 331/25

[51] Int. Cl. .................... H03b 3/04

[58] Field of Search .................... 331/15, 17, 10, 11, 25, 331/1 A

[56] References Cited

UNITED STATES PATENTS

| | | | |
|---|---|---|---|
| 3,350,658 | 10/1967 | Walker | 331/17 |
| 3,460,052 | 8/1969 | Rader et al. | 331/17 X |
| 3,573,649 | 4/1971 | West | 331/17 X |

*Primary Examiner*—Siegfried H. Grimm

*Attorney, Agent, or Firm*—Johnson, Dienner, Emrich & Wagner

[57] ABSTRACT

A phase lock loop having a crystal voltage controlled oscillator (VCO) which includes a drift compensation mechanism incorporated in the feedback portion of the loop in order to track the difference between a reference input signal and the VCO center frequency which normally tends to drift with age. If the reference signal is lost, the compensation mechanism allows the apparent center frequency for the VCO to be held close to the last known reference value rather than the potentially drift affected real center frequency of the crystal.

12 Claims, 5 Drawing Figures

DRIFT COMPENSATED PHASE LOCK LOOP

BACKGROUND OF THE INVENTION

1. Field of the Invention

The invention relates in general to the operation of phase lock loops employing crystal oscillators, and more particularly to apparatus and methods for compensating for drift due to crystal age in such loops.

2. Description of the Prior Art

A standard phase lock loop comprises a phase comparator, a loop filter and a voltage controlled oscillator (VCO). The phase comparator is usually a multiplier. The loop filter may be a passive or active type filter depending on the tracking requirements and also on the necessary loop gain.

Phase lock loops often serve as the master clocks in highly synchronous systems, such as a digital telephone switching system. As such, the master clock must be a highly reliable and accurate unit. Normally this master clock is locked to an external reference so that, in the telephone switching system, for example, complete frequency synchronization is maintained with a plurality of switching offices. If the external reference is lost, then the VCO in the phase lock loop must retain sufficient accuracy to prevent data slippages, buffer overflows and underflows, clock inaccuracies, and other deleterious affects.

The VCO in a phase lock loop will frequently employ a crystal to control its center frequency. The crystal frequency however tends to drift with both crystal aging and temperature variations. Although rubidium and cesium clocks are superior to crystal oscillators with respect to aging, they are very expensive.

In order to cope with temperature variations, the prior art teaches placing the crystal in an "oven." The simplest type of oven comprises a filament heater and a thermostat. The thermostat controls the temperature to within a few degrees. A more advanced type of oven is a portional type oven wherein the amount of heating is determined directly from a temperature sensor within the oven. The more sophisiticated ovens are double ovens. The double oven gives two layers of temperature control and results in much finer control over the actual crystal temperature. However, a double oven is a large cumbersome device, whereas the portional or thermostatic types are very small. Thus, the selection of the type of oven typically depends on the results of a study of the particular types of crystals which may be utilized and their temperature drift coefficients. Hence, several solutions have been set forth in the prior art in an attempt to solve the problem of crystal frequency drift as a result of temperature variation.

Despite the accurate temperature control which may be obtained by utilizing as sophisticated a device as a double oven crystal oscillator, accuracy may still be seriously diminished over a long period of time due to the aging drift of the crystal itself. In order to cope with drift due to crystal aging, it would be desirable to have a drift compensation mechanism which compensates for crystal aging by continuously readjusting to the external reference. Thus, if the reference is at some point in time lost, the compensation mechanism would retain the last known external reference frequency. Crystal drift would thus begin from the reference frequency retained by the compensation mechanism rather than from the center frequency of the aged crystal. In addition to providing a more accurate reference, drift compensation would allow aged crystals to be utilized for longer periods of time. Thus, the interval between replacement of crystals may be increased.

It is an object of this invention to minimize the effects of crystal aging of VCO's typically employed in phase lock loops.

It is a further object of this invention to provide a drift compensation mechanism which continually readjusts itself to an external reference.

It is still a further object of this invention to present methods and apparatus for performing drift compensation in a phase lock loop.

SUMMARY OF THE INVENTION

According to the invention a drift compensation mechanism is incorporated in the feedback portion of the phase lock loop. The mechanism tracks the difference between a reference input signal and the VCO center frequency. If the reference signal is lost, the compensation mechanism allows the apparent center frequency for the VCO to be held close to the last known reference rather than the potentially drift affected real center frequency of the crystal.

The new components introduced into the loop are, according to the preferred embodiment of the invention, in combination, two voltage comparators, one n bit up/down counter, one n bit digital to analog converter, one analog adder circuit, an external signal presence monitor, and a clock. The manner in which these new loop components function to serve as a compensation mechanism for drift due to crystal aging will be discussed in detail hereinafter.

A feature of the invention is the inherent simplicity of the drift compensation mechanism itself.

A further feature of the invention is the long term stability and accuracy of a phase lock loop employing the drift compensation mechanism.

A still further feature of the invention is a reduction in the maintenance requirement for the phase lock loop since the frequency with which aged crystals must be replaced is reduced.

BRIEF DESCRIPTION OF THE DRAWINGS

These and other features of the present invention will be more readily apparent from the following detailed description taken in conjunction with the accompanying drawing.

DETAILED DESCRIPTION

Figure 1:
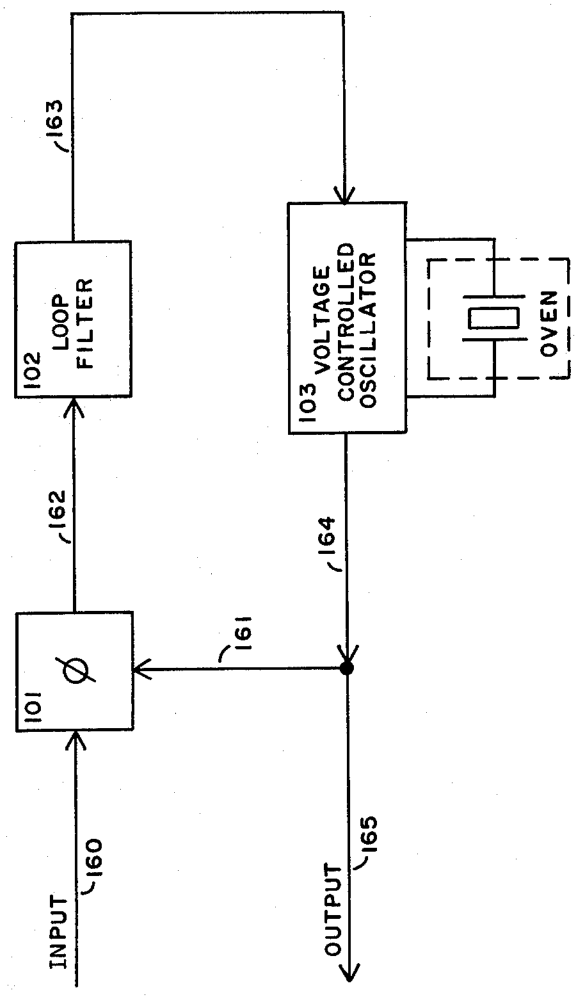
PRIOR ART FIG. 1
FIG. 1 depicts a prior art phase lock loop.

FIG. 1 depicts a prior art phase lock loop. Phase comparator 101 is shown as receiving input from links 160 and 161. Link 160 is actually the reference signal input path (outside the loop), while link 161 is the feedback portion of the loop. Comparator 101 is shown connected to loop filter 102 via link 162. Loop filter 102 is shown interconnected to voltage controlled oscillator 103 via link 163. Finally VCO 103 is shown interconnected to the feedback portion of the loop (link 161) via link 164, and to output link 165.

Although phase lock loops of the type depicted in FIG. 1 are well known to those of ordinary skill in the art, a brief description of the operation of a standard phase lock loop will now be presented.

As indicated hereinbefore the standard loop comprises a phase comparator (unit 101), a loop filter (unit 102) and a VCO (unit 103), interconnected in the manner depicted in FIG. 1. Comparator 101 compares the phase of a periodic input signal, referred to hereinbefore as the reference signal, against the phase of the VCO. The output of unit 101 is a measure of the phase difference between its two inputs. The difference voltage is then filtered by unit 102 and then is applied to VCO 103. The voltage applied to VCO 103, hereinafter referred to as the control voltage, changes the frequency of the signal output of the VCO in a direction that reduces the phase difference between the reference signal and the signal output by the VCO.

When the loop is "locked", the control voltage is such that the frequency of VCO 103 is exactly equal to the average frequency of the input signal.

To maintain the control voltage needed for lock it is generally necessary to have a non zero output from unit 101. Consequently, the loop operates with some phase error present. As a practical matter, however, this error tends to be small in a well designed loop.

Figure 2:
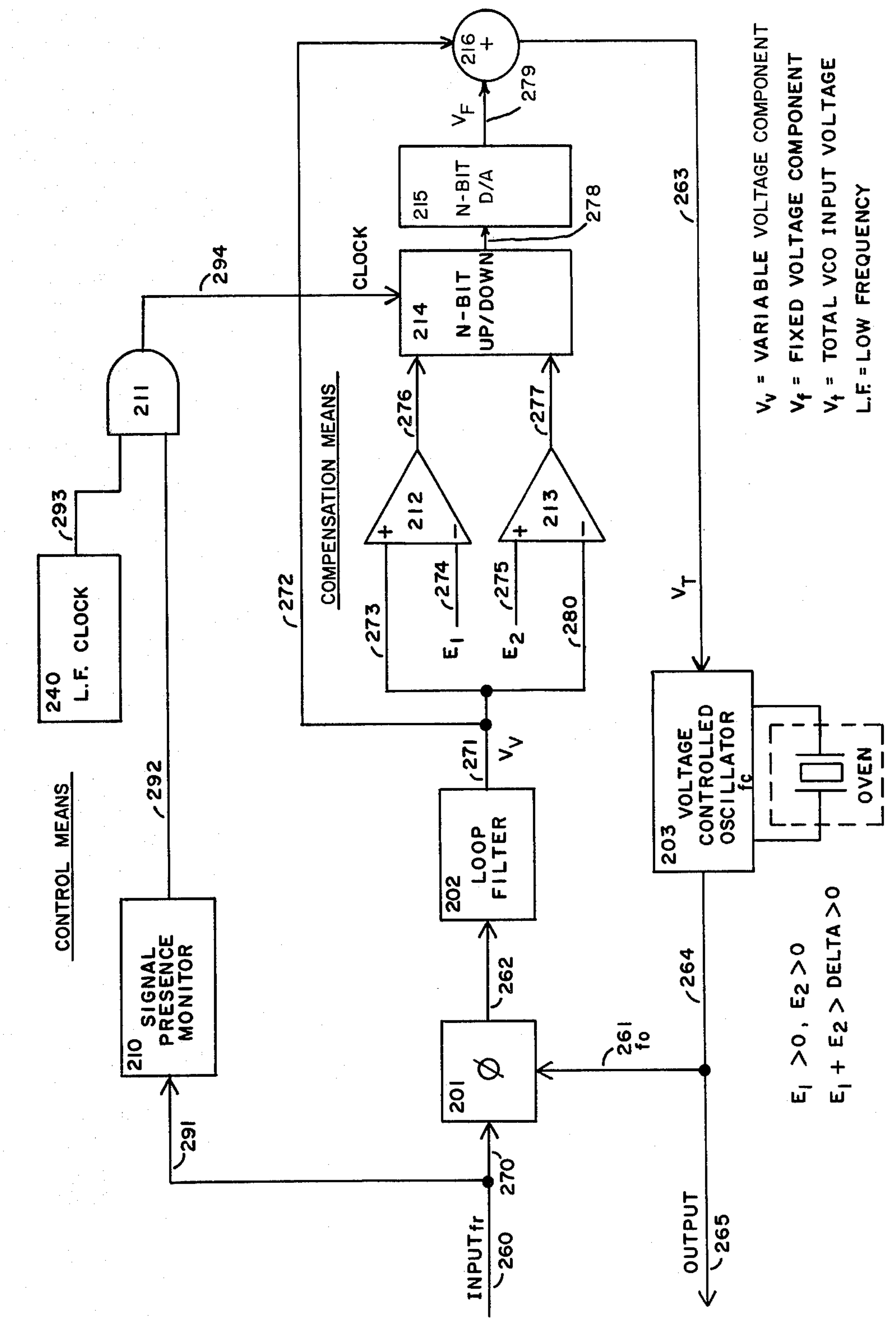
FIG. 2 depicts a drift compensated phase lock loop built in accordance with the principles of the invention.

FIG. 2 depicts an improvement over the loop depicted in FIG. 1 in that means are introduced into the loop for compensating for drift due to crystal aging. Crystal aging and its effects have been discussed previously herein.

The improved loop depicts link 260 as the reference signal input link, said signal being input to phase comparator 201 and to signal presence monitor 210. Comparator 201 may for example be realized by an exclusive OR gate such as SN7486. Monitor 210 may be implemented with a Schmitt trigger circuit. Links 270 and 291 serve to carry the reference signal from link 260 to units 201 and 210 respectively. Signal presence monitor 210 outputs a signal onto link 292 as long as the reference signal is present. The output signal from monitor 210 allows a clock pulse to pass through AND gate 211 whenever link 293 is energized by the clock. The clock, shown in FIG. 2 as unit 240 may comprise an NE555 oscillator. In addition to receiving the reference signal as input, phase comparator 201 also receives as input, signals appearing on link 261, the feedback portion of the loop. It is assumed that the phase comparator is of a type such that loss of either input results in zero output. Otherwise, the signal presence monitor 210 must have a means of opening the loop at link 262 or 271 or clamping these links to zero voltage.

The output of comparator 201 is input to loop filter 202 via link 262. Loop filter 202 may comprise a standard RC filter which outputs a signal which, via links 271 and 272, is summed at analog adder unit 216 with the signal produced across devices 212, 213, 214 and 215. A suitable analog adder for use in the disclosed embodiment may comprise a National Semiconductor LN318 adder. The signal appearing on link 263 is the total VCO control voltage. Units 212 and 213 are voltage comparators and are connected in parallel to compare the loop filter output signal with reference voltages $E_1$ and $E_2$, the comparison function to be described in detail below. Units 212 and 213 may comprise Precision Monolithic CMP-01 circuits. Unit 214 is an n bit up/down counter under the control of clock output signals appearing on link 294, for incrementing or decrementing a value stored in counter 214 depending on the magnitude of the loop filter output as compared with reference $E_1$ and $E_2$. Counter 214 may comprise SN74191 counter. Finally, unit 215 is a digital to analog converter which may comprise a Motorola Converter MC1508 for converting the digital value in counter 214 into a signal which is one of the summands at unit 216. VCO 203 may comprise a Texas Instruments SN74124 circuit.

Thus, referring to FIG. 2, the improvement over the loop depicted in FIG. 1 comprises, at least according to the preferred embodiment of the invention, the introduction of the depicted combination of units 212, 213, 214, 215 and 216, which may be thought of collectively as "compensation means" and the depicted combination of units 210, 211 and 240, which may be thought of collectively as "control means."

Loop operation will now be explained in detail with reference to an illustrative example wherein the components of the preferred embodiment of the invention comprise the improved phase lock loop.

Clock 240 is generally a very low frequency clock with a rate on the order of only 1 pulse per hour or even per day. Pulses from clock 240 are supplied via link 293, gate 211 and link 294 to counter 214 as long as signal presence monitor 210 outputs a signal on link 292. The signal on link 292 is indicative of the presence of the reference input signal on link 260. This signal allows counter 214 to be incremented or decremented in a manner to be described below. Since crystal drift with age is a very slow process, the compensating circuit need only be able to change at one of the slow rates indicated above.

The two voltage comparators introduced into the loop, units 212 and 213, are biassed with positive voltages $E_1$ and $E_2$ to effectively produce an upper and lower comparator. The step size of the digital to analog converter is defined to be some arbitrary, but fixed value, delta. The sum of $E_1$ and $E_2$ must be greater than delta to avoid oscillation of the compensation mechanism.

If the voltage input via links 273 and 275 to upper comparator 212 and lower comparator 213, respectively, is greater than $E_1$, then, according to the illustrative example being set out herein, up/down counter 214 is to be incremented by 1. If the input voltage to upper comparator 212 and lower comparator 213 is more negative than the value of $-E_2$ then, according to the illustrative example, up/down counter 214 is to be decremented by 1. If the input voltage is within the limits of $+E_1$ and $-E_2$ then, up/down counter 214 is neither incremented or decremented but remains the same.

Up/down counter 214 directly drives digital to analog converter 215. The output of digital to analog converter 215 provides an analog compensation signal proportional to the value in counter 214 to analog adder circuit 216. This proportional signal is summed with the voltage on link 272 to provide a compensated VCO input control voltage.

External signal presence monitor 210 is used to determine when the reference signal on link 260 is lost. Until such time as the reference signal *fr* is lost, the compensation means CM continues to compensate for drift due to crystal aging by periodically making the above indicated comparisons, and modifying the VCO input control voltage in proportion to the value which is stored in the counter. However, when and if the reference signal *fr* is lost, the counter 214 is "frozen," i.e., signal presence monitor 210 stops outputting the signal on link 292 which periodically enabled gate 211, which, in turn, periodically enabled counter 214 to be modified. The value frozen in counter 214 is proportional (to within comparator limits) to the difference between the external reference frequency and the actual center frequency of the crystal at the time the reference signal *fr* is lost. From the point in time that the reference signal is lost, digital to analog converter 215 continually outputs a voltage $V_f$ which is proportional to the frozen counter value and supplies this voltage $V_f$ to VCO 203 to cause VCO 203 to appear to have a center frequency that is equal to the frequency of the reference signal fr at the time the reference signal was lost, regardless of the actual crystal center frequency at that time.

Figure 3:
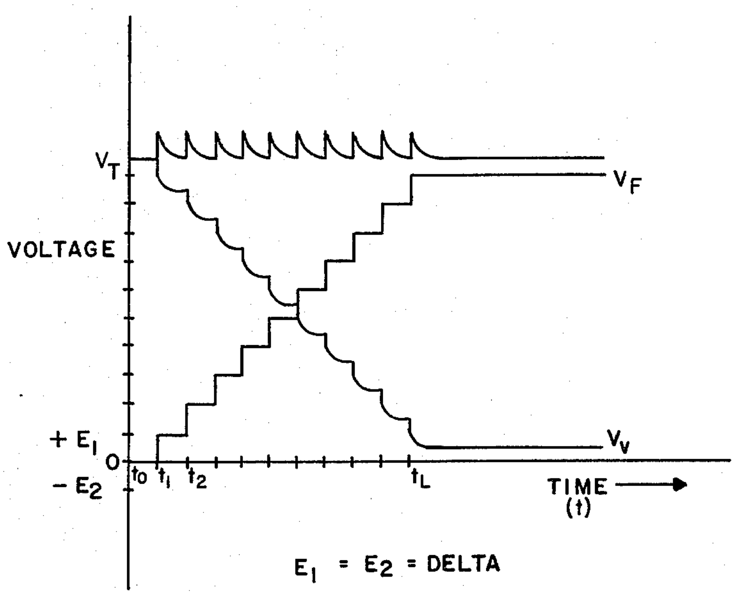
FIG. 3 depicts the input voltages at start up time for the phase lock loop of FIG. 2.
Figure 4:
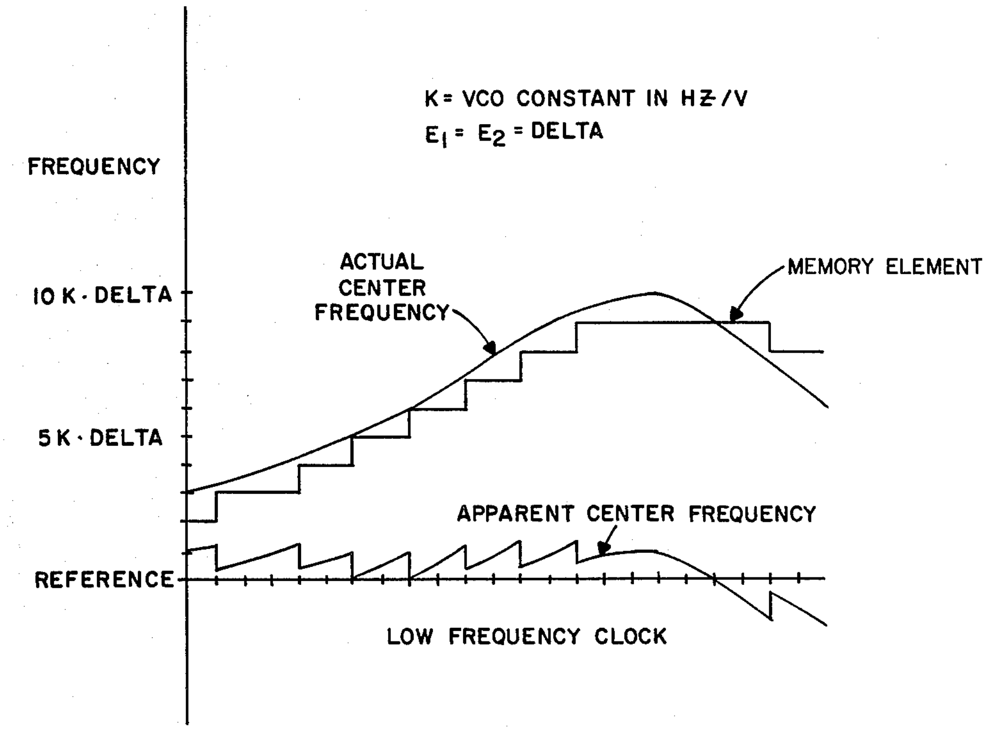
FIG. 4 depicts the effect of memory on the center frequency of the VCO depicted in FIG. 2.
Figure 5:
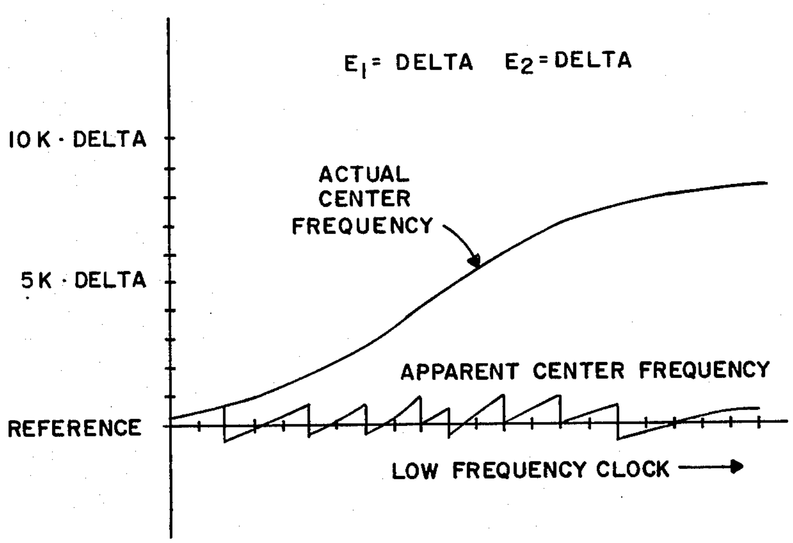
FIG. 5 depicts the characteristics of the loop of FIG. 2 when optimized for monotonic drift.

The operation of the improved loop can be better understood with reference to FIGS. 3, 4 and 5.

FIG. 3 shows a start up sequence that would result from a loop comprised of components as set forth in the illustrative example. For the sake of illustration and with reference to FIGS. 2 and 3, it is assumed that voltages $E_1$ and $E_2$ are chosen to be equal to delta. At $t_0$, the voltage output $V_f$ of the digital to analog converter 215 is shown in FIG. 3 as zero. At this time, it is assumed that the circuit is operating as a normal phase lock loop, and eventually settles to some steady state voltage $V_T$, (see $t_0$) where $V_T$ corresponds to the signal appearing on link 263. It is further assumed that counter 214 is originally set at zero, and assuming the center frequency fc of the oscillator 203 is chosen to be the same as the reference frequency *fr*, the output of the compensation means CM will be $V_f = 0$. At this time ($t_0$) $V_T$ is also equal to $V_V$, (the signal appearing on link 271) since $V_F$, the signal appearing on link 279, is zero, and since $V_T = V_F + V_V$.

In FIG. 3 there is shown a representative set of transients for $V_T$, $V_V$ and $V_F$ during a startup sequence as up/down counter 214 and digital to analog converter 215 eventually track close to the voltage $V_T$. As the first clock pulse $t_1$ is fed to counter 214, counter 214 is enabled and is incremented or decremented, as the case may be, by the output of the comparators 212, 213. Since the value of the voltage $V_V$ output from loop filter 202 is greater than $E_1$ (i.e., the loop has adjusted in the conventional manner to a steady state voltage as described above) up/down counter 214 is incremented by 1 which increases the voltage $V_F$ from zero to delta. Since $V_T$ is the sum of $V_F$ and $V_V$, the voltage $V_T$ immediately increases by delta ($t_1$). Since this puts the loop out of balance, a transient period is involved ($t_1$ to $t_2$) in which the voltage $V_T$ eventually settles back down to the assumed steady state (i.e., the same value as before).

After this transient has settled, the value of $V_V$ is delta less than it was before the comparison and transition. At the next comparison time $t_2$ the up/down counter 214 is again incremented by 1 increasing $V_F$ to twice delta. Another transient occurs in $V_T$ and $V_V$ after which $V_T$ settles back to its original value and $V_V$ settles at twice delta below where it started out. Eventually $V_F$ will increase until it is within $E_1$ of the steady state value of $V_T$. In this case the steady state value of $V_V$ is less than $E_1$.

FIG. 4 shows the effect of the memory tracking a crystal frequency drift. This is an extreme example, for the sake of illustration only, since the actual drift of the crystal frequency will probably be nowhere near that which is shown in FIG. 4. The vertical axis is calibrated in frequency rather than voltage to show the effect on the real and apparent center frequency of the crystal VCO. In this case again, $E_1$ and $E_2$ are both equal to delta. The actual center frequency of the crystal in FIG. 4 is shown to drift in the positive direction, peak out, and drift in the negative direction. The memory element in the loop tracks behind the positive going drift of the crystal. When the direction of the drift reverses, a crossover occurs, and the memory element again trails behind the actual center frequency drift. The apparent center frequency of the loop is also shown in FIG. 4. The apparent center frequency holds very close to the reference value and does not follow the crystal drift appreciably. This is exactly what is desired.

Crystals tend to drift with age in one direction. This direction may or may not depend on the particular cut of the crystal. However, if the crystal aging can be guaranteed to be monotonic then increased accuracy of the improved loop can be obtained. In this case it would be advantageous to choose $E_1$ to be equal to ½ delta. $E_2$ must be greater than ½ delta. For purposes of this illustration it is convenient to set $E_2$ equal to delta. A tracking example is shown in FIG. 5 for this case. Even though the crystal drift may be considerable, the apparent center frequency of the VCO holds very close to the reference value.

It should be noted that the improved phase lock loop may require only an inexpensive crystal since some drift due to temperature variation might also be absorbed by a memory loop of the type described herein. In this case $E_1$ and $E_2$ should be chosen judiciously to allow for reasonable temperature variation.

In conclusion a phase lock loop has been described which utilizes a crystal VCO for long term stability and accuracy. Compensation for aging of the crystal is accomplished by locking to an external reference and providing a tracking and memory element within the phase lock loop. If the reference is lost then the loop returns to its last known reference value rather than to the drifted center frequency of the aged crystal. The loop can be implemented with available, economical integrated circuits and components.

It should be noted that the invention described herein has been illustrated with reference to a particular embodiment. It is to be understood that many details used to facilitate descriptions of such a particular embodiment are chosen for convenience only without limitations on the scope of the invention. Many other embodiments may be devised by those skilled in the art without departing from the scope and spirit of the invention. Accordingly, the invention is intended to be limited only by the scope and spirit of the appended claims.

What is claimed is:

1. In a phase locked loop circuit having a crystal controlled oscillator which has a center operating frequency $f_c$ and output frequency $f_o$, reference means which provide a reference frequency $f_r$, first means, including phase comparator means connected to said reference means and to said oscillator for providing an output signal which represents the difference in the values of said frequency signals $f_r$ and $f_o$, the improvement comprising compensation means, connected to the output of said first means, for receiving said output signal and for generating a frequency representative signal $V_F$ which initially represents the value of the center frequency $f_c$ of said oscillator, including means operative whenever said reference frequency is not present for holding the apparent center frequency of said oscillator to the last reference frequency known, and control means connected between said reference means and said compensation means, said control means being enabled whenever said reference frequency is present to selectively control said compensation means to adjust the value of said frequency representative signal to represent changes in the value of said center frequency $f_c$ of the crystal controlled oscillator.

2. A phase locked loop circuit as set forth in claim 1 which includes means for summing the frequency representative signal generated by said compensation means and the signal output of said first means for controlling said voltage controlled oscillator.

3. A phase locked loop circuit as set forth in claim 1 in which said first means provides a signal $V_V$ which indicates the difference between the frequency output $f_o$ of said voltage controlled oscillator and said reference frequency $f_r$, and in which said compensation means includes summation means for adding said signals $V_V$ and $V_F$ to provide a summated signal $V_T$ to said voltage controlled oscillator.

4. A phase locked loop as set forth in claim 3 in which said signal $V_V$ provided by said first means comprises a varying DC level signal, the value of which represents the difference in the frequencies $f_o$ and $f_r$, and in which said compensation means comprises at least one reference signal, comparison means for comparing said signal $V_V$ with said one reference signal, and means for adjusting the value of said generated signal $V_F$ in accordance with the value of the output of said comparison means.

5. A phase locked loop circuit as set forth in claim 3 in which said compensation means include means for providing at least a first reference signal which represents a predetermined difference in phase of said frequency reference signal $f_r$ and said oscillator output frequency signal $f_o$, and means operative to provide a K delta signal to said summation means for summing with said output signal, provided by said first means, whenever said output signal exceeds said first reference signal.

6. In a phase locked loop circuit, a crystal controlled oscillator which has a center operating frequency $f_c$ and output frequency $f_o$, reference means which provide a reference frequency $f_r$, and first means for providing an output signal $V_V$ which represents the difference in the values of said frequency signals $f_r$ and $f_o$, compensation means connected to the output of said first means including second means responsive to said output signal for generating and storing a first signal which initially represents the value of the center frequency $f_c$ of said oscillator, and control means, connected to said reference means, including signal monitor means, for preventing operation of said second means during periods in which said reference frequency signal $f_r$ is absent, whereby the value of said first signal as stored is frozen in said second means, and means for deriving a signal from said stored signal for use with said output signal $V_V$ to control said oscillator.

7. An improved phase locked loop of the type wherein a phase comparator, loop filter and crystal voltage controlled oscillator having a center frequency $f_c$ are loop connected to lock the phase of a signal output from said loop with the phase of a frequency reference signal $f_r$, the improvement comprising:

a. compensation means connected between said loop filter and said crystal voltage controlled oscillator operative to provide a compensating signal which represents changes in the frequency output of said oscillator due to variations in the oscillator center frequency characteristic, and b. control means for periodically enabling said compensation means to update said compensating signal to represent the changes which occur in said frequency output of said oscillator by reason of said variations.

8. An improved phase locked loop as set forth in claim 7 wherein said compensation means further comprises:

a. comparison means connected to said loop filter for providing a first signal whenever the value of the loop filter output signal exceeds the value of a first reference signal and a second signal whenever the value of said loop filter output is less than a second reference signal;

b. signal generating means connected to said comparison means selectively enabled to be incremented and decremented responsive to said first and second signals respectively; and c. means for summing the output of said signal generating means with the output of said loop filter to produce a control voltage which is proportional to the difference between the reference input signal frequency $f_r$ and the actual center frequency $f_c$ to control said crystal voltage controlled oscillator.

9. An improved phase locked loop as set forth in claim 7 wherein said compensation means further comprises:

a. first means connected to said loop filter to compare the output of said loop filter with a first reference signal, and for generating a first signal whenever the value of the loop filter output signal exceeds the value of said first reference signal;

b. second means connected to said loop filter to compare the output of said loop filter with a second reference signal, and for generating a second signal whenever said loop filter output fails to exceed said second reference signal;

c. counter means connected to said first and second means having an increment input connected to said first means and a decrement input connected to said second means;

d. means for selectively enabling said counter means to be responsive to the signals on said increment and decrement inputs at the time of enablement;

e. conversion means for converting the count in said counter means into an analog signal, the magnitude of which is proportional to the count stored in said counter;

f. means for summing the output of said conversion means with the output of said loop filter to produce a control voltage which is proportional to the difference between the reference input signal frequency $f_r$ and the actual center frequency $f_c$ of said crystal voltage controlled oscillator; and g. means for inputting said control voltage to said crystal voltage controlled oscillator.

10. An improved phase locked loop as in claim 7 wherein said control means further comprise a. an input circuit over which said input reference signal $f_r$ is input;

b. a signal presence monitor means for generating a first output signal to represent the presence of a reference signal on said input circuit;

c. clock means for periodically generating a second output signal; and d. means connected to said clock means and said signal presence monitor means for providing a third output signal responsive to simultaneous input of said first and second output signals; and e. means in said compensation means for updating said compensating signal in response to receipt of said third output signal.

11. An improved phase lock loop of the type wherein a phase comparator, loop filter and crystal voltage controlled oscillator having a center frequency are loop connected to lock the phase of the loop output signal to the phase of a reference signal received over an input circuit, the improvement comprising:

a. first means connected to said loop filter for comparing the output of said loop filter with a first reference signal and for generating a first adjust signal whenever said loop filter exceeds the value of said first reference signal;

b. second means connected to said loop filter output for comparing the output of said loop filter with a second reference signal, and for generating a second adjust signal whenever said loop filter output fails to exceed the value of said second reference signal;

c. a signal presence monitor responsive to generate a third signal whenever said reference signal is applied to said input circuit;

d. a clock for periodically generating a fourth signal;

e. counter means connected to said first and second means to be incremented by one unit in response to input of one of said first adjust signals, and to be decremented in response to input of one of said second adjust signals;

f. means responsive to said third and fourth signals connected to said counter means for periodically enabling said counter means to be responsive to the signals output by said first and second means;

g. digital/analog means for converting the instantaneous digital value in said counter means into an analog signal having a magnitude which is proportional to the value in said counter;

h. means for summing the output of said digital/analog means with the output of said loop filter to produce a control voltage proportional to the difference between said reference input signal frequency and the actual center frequency of said crystal voltage controlled oscillator; and means for inputting said control voltage to said crystal voltage controlled oscillator.

12. An improved phase locked loop of the type wherein a phase comparator, loop filter and crystal voltage controlled oscillator having a center frequency $f_c$ are loop connected to lock the phase of the loop output signal to the phase of a reference signal which is received over an input circuit, the improvement comprising:

a. first means connected to said loop filter for comparing the output of said loop filter with a first reference signal and for generating a first adjust signal whenever said loop filter exceeds the value of said first reference signal;

b. second means connected to said loop filter for comparing the output of said loop filter with a second reference signal, and for generating a second adjust signal whenever said loop filter output fails to exceed the value of said second reference signal;

c. a signal presence monitor responsive to generate a third signal whenever said reference signal is applied to said input circuit;

d. clock means for periodically generating a fourth signal;

e. counter means connected to said clock means to be periodically enabled by said third signal and incremented by one unit in response to simultaneous input of one of said first adjust signals and to be decremented in response to simultaneous input of one of said second adjust signals;

f. conversion means for converting the count in said counter means into an analog signal having a magnitude which is proportional to the count in said counter;

g. means for summing the output of said conversion means with the output of said loop filter to produce a control voltage $V_T$ which is proportional to the difference between said reference input signal frequency $f_r$ and the actual center frequency $f_c$ of said crystal voltage controlled oscillator; and h. means for coupling said control voltage to said crystal voltage controlled oscillator.

* * * * *